(12) United States Patent
Guo

(10) Patent No.: US 9,299,727 B2
(45) Date of Patent: Mar. 29, 2016

(54) ARRAY SUBSTRATE AND MANUFACTURING METHOD THEREOF AS WELL AS DISPLAY PANEL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Jian Guo, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/387,885

(22) PCT Filed: Dec. 9, 2013

(86) PCT No.: PCT/CN2013/088839
§ 371 (c)(1),
(2) Date: Sep. 25, 2014

(87) PCT Pub. No.: WO2015/010416
PCT Pub. Date: Jan. 29, 2015

(65) Prior Publication Data
US 2015/0325591 A1 Nov. 12, 2015

(30) Foreign Application Priority Data
Jul. 23, 2013 (CN) .......................... 2013 1 0311665

(51) Int. Cl.
*H01L 27/12* (2006.01)
*H01L 21/3065* (2006.01)
(Continued)

(52) U.S. Cl.
CPC .......... *H01L 27/124* (2013.01); *G02F 1/13394* (2013.01); *H01L 21/3065* (2013.01); *H01L 21/31116* (2013.01); *H01L 27/1259* (2013.01)

(58) Field of Classification Search
CPC .............. H01L 27/1214; H01L 27/124; H01L 27/1251; H01L 21/31053; H01L 21/31055; H01L 21/31111; H01L 21/31116; H01L 21/3065; H01L 27/1259; G02F 1/1339; G02F 1/13394; G02F 2001/13398
See application file for complete search history.

(56) References Cited

U.S. PATENT DOCUMENTS 6,268,898 B1 * 7/2001 Ihara ..................... G02F 1/1345
349/139
6,528,357 B2 * 3/2003 Dojo ................... H01L 27/1214
257/E21.414

(Continued)

FOREIGN PATENT DOCUMENTS

CN 101398580 A 4/2009
CN 101762916 A 6/2010
(Continued)

OTHER PUBLICATIONS

English Translation of the International Search Report of PCT/CN2013/088839 published in English on Jan. 29, 2015.
(Continued)

*Primary Examiner* — Khiem D Nguyen
*Assistant Examiner* — Pauline Vu
(74) *Attorney, Agent, or Firm* — Collard & Roe, P.C.

(57) ABSTRACT

An array substrate and a manufacturing method thereof as well as a display panel are provided. The manufacturing method comprises: forming a pattern including a scanning line (32) and a spacer base (33) on a same layer of a substrate (31); forming a gate insulating layer (34); forming a pattern including an active layer (35), a data line, a source electrode and a drain electrode; forming a passivation layer (36); sequentially etching the passivation layer (36) and the gate insulating layer (34) through a dry etching method to form a via hole (38) exposing the spacer base (33), and inducing materials generated from an etching process in a reaction cavity to deposit on a surface of the spacer base (33) through an electric field formed by the spacer base (33) exposed in the via hole (38) and etching gas adopted in the etching process, to form a spacer (39).

18 Claims, 2 Drawing Sheets

(51) Int. Cl.
  *H01L 21/311*  (2006.01)
  *G02F 1/1339*  (2006.01)

(56) References Cited

U.S. PATENT DOCUMENTS

| | | | | |
|---|---|---|---|---|
| 2002/0001777 | A1* | 1/2002 | Kido | H01L 21/31116 430/313 |
| 2004/0171200 | A1* | 9/2004 | Maeda | G02F 1/13458 438/149 |
| 2006/0205125 | A1* | 9/2006 | Bae | H01L 29/458 438/149 |
| 2006/0268216 | A1* | 11/2006 | Song | G02F 1/13394 349/158 |
| 2007/0015319 | A1* | 1/2007 | Chin | H01L 21/31116 438/149 |
| 2008/0090341 | A1* | 4/2008 | Tanaka | G02F 1/136227 438/158 |
| 2008/0198317 | A1* | 8/2008 | Tseng | G02F 1/13394 349/138 |
| 2009/0086134 | A1* | 4/2009 | Yao | G02F 1/133512 349/106 |
| 2009/0295747 | A1* | 12/2009 | Hsieh | G06F 3/044 345/173 |
| 2010/0225608 | A1* | 9/2010 | Zhou | G02F 1/13338 345/173 |
| 2011/0116029 | A1* | 5/2011 | Funahashi | G02F 1/136227 349/153 |
| 2013/0162927 | A1* | 6/2013 | Nagami | G02F 1/1339 349/43 |

FOREIGN PATENT DOCUMENTS

| | | |
|---|---|---|
| CN | 103413782 A | 11/2013 |
| WO | 2015010416 A1 | 1/2015 |

OTHER PUBLICATIONS

International Search Report, International Preliminary Report on Patentability and Written Opinion of the International Searching Authority of PCT/CN2013/088839 in Chinese, mailed Apr. 23, 2014.

Written Opinion of the International Searching Authority for PCT/CN2013/088839 in English mailed on Apr. 23, 2014.

International Search Report of the International Searching Authority for PCT/CN2013/088839 in English mailed on Apr. 23, 2014.

* cited by examiner

ARRAY SUBSTRATE AND MANUFACTURING METHOD THEREOF AS WELL AS DISPLAY PANEL

CROSS REFERENCE TO RELATED APPLICATIONS

This application is the National Stage of PCT/CN2013/088839 filed on Dec. 9, 2013, which claims priority under 35 U.S.C. §119 of Chinese Application No. 201310311665.X filed on Jul. 7, 2013, the disclosure of which is incorporated by reference.

TECHNICAL FIELD

Embodiments of the invention relate to an array substrate and a manufacturing method thereof as well as a display panel.

BACKGROUND

With the development of thin film transistor liquid crystal display (TFT-LCD) technology and advancement of the industrial technologies, the liquid crystal display technology has replaced the cathode ray tube display technology as the mainstream technology in the common display field.

At present, Advanced-Super Dimensional Switching (ADS) liquid crystal display technology has become as a mainstream technology in the high-grade, high-precision and advanced display field. The advanced-super dimensional switching technology, as a core technology of wide viewing angle in planar electric field, forms a multi-dimensional electric field through an electric field generated from edges of slit electrodes in a same plane and an electric field generated between a slit electrode layer and a plate electrode layer, so that liquid crystal molecules at all alignment between the slit electrodes in a liquid crystal cell and above the electrodes can be rotated, thus improving liquid crystal work efficiency and enhancing light transmittance efficiency. The advanced-super dimensional switching technology can enhance the picture quality of a TFT-LCD product, and has such advantages as high resolution, high transmittance, low power consumption, wide viewing angle, high aperture ratio, low chromatic aberration and no push mura. The technology is widely applied to high-end phone screen, mobile application product, television and other fields.

FIG. 1 is a structural schematic diagram of a conventional liquid crystal display panel. It can be seen from FIG. 1 that the display panel comprises an opposite substrate 11, an array substrate 12, and a liquid crystal layer 13 disposed between the opposite substrate 11 and the array substrate 12. On the opposite substrate 11 there are provided with spacers 110, which are generally about 2-3 microns high if actually required. The function of the spacers 110 is to maintain a cell gap so as to avoid difficulty in normal display if liquid crystal is extruded and deformed. At present, the spacers are mainly manufactured through a photolithograph method by coating a spacer photosensitive material on the surface of the opposite substrate and having it exposed and then developed. In a specific manufacturing process, the spacer photosensitive material is patterned by exposing with a grayscale mask or a semitransparent mask, and the spacer photosensitive material includes resin as the main component. Due to the relatively low hardness of resin, the manufactured spacers are easy to get broken, and a broken spacer cannot perform the function of supporting, so that the surrounding liquid crystal is extruded and deformed and the deformed liquid crystal molecules cannot be normally rotated, finally resulting in that the liquid crystal display is poor in display effect and even cannot display normally.

SUMMARY

In one aspect, an embodiment of the present invention provides a manufacturing method of an array substrate. The method comprises: forming a pattern including a scanning line and a spacer base on a same layer of a substrate; forming a gate insulating layer; forming a pattern including an active layer, a data line, a source electrode and a drain electrode; forming a passivation layer; sequentially etching the passivation layer and the gate insulating layer through a dry etching method to form a via hole exposing the spacer base, and inducing materials generated from an etching process in a reaction cavity to deposit on a surface of the spacer base, through an electric field formed by the spacer base exposed in the via hole and etching gas adopted in the etching process, to form a spacer.

For example, in the dry etching process, the passivation layer, the active layer and the gate insulating layer are sequentially etched to form the via hole exposing the spacer base.

For example, in the dry etching process, a first etching gas containing sulfur hexafluoride gas and chlorine gas is used for etching the active layer.

For example, in the dry etching process, a second etching gas containing sulfur hexafluoride gas, chlorine gas and oxygen gas is used for etching the gate insulating layer and the passivation layer.

For example, the second etching gas further contains helium gas.

For example, when temperature in the reaction cavity is at 30° C.~50° C., and pressure is 50~70 Pa, a flow of the sulfur hexafluoride gas in the second etching gas is 50~200 sccm, a flow of the oxygen gas is 100~300 sccm, a flow of the helium gas is 50~100 sccm and a flow of the chlorine gas is 10~50 sccm; when power applied to a plasma etching device is 5000~9000 watts, a growth speed of the spacer is 150~250 Å/s.

For example, the spacer contains silicon chloride, the silicon chloride being a reactant of a manufacturing material of the gate insulating layer and the passivation layer with the etching gas.

For example, the spacer further contains a metal chloride; the metal chloride being generated from a reaction between the spacer base and the etching gas.

For example, the spacer is a columnar spacer.

For example, the spacer base is same as the scanning line in manufacturing material.

For example, the spacer base and the scanning line are arranged in parallel, or the spacer base and the scanning line are arranged in a crossed manner.

In another aspect, an embodiment of the present invention provides an array substrate. The array substrate comprises a substrate, a scanning line, a spacer base, a gate insulating layer, an active layer, a passivation layer, a spacer and a via hole. The spacer base and the scanning line are arranged on a same layer and are located on the substrate; the gate insulating layer is located on the spacer base and the scanning line; the active layer is arranged on the gate insulating layer; the passivation layer is arranged on the active layer; the via hole runs through the gate insulating layer and the passivation layer to expose the spacer base; and the spacer is arranged in the via hole and is located on the spacer base.

For example, the via hole runs through the gate insulating layer, the active layer and the passivation layer to expose the spacer base.

For example, the spacer contains silicon chloride.

For example, the spacer further contains a metal chloride.

For example, the spacer is a columnar spacer.

For example, the spacer base is same as the scanning line in manufacturing material.

For example, the spacer base and the scanning line are arranged in parallel, or the spacer base and the scanning line are arranged in a crossed manner.

In another aspect, an embodiment of the present invention provides a display panel. The display panel comprises the array substrate mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
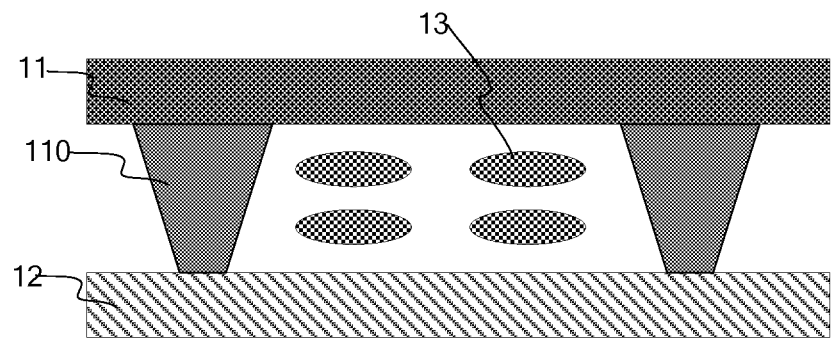
FIG. 1 is a structural schematic diagram of a conventional liquid crystal display panel.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An embodiment of the present invention provides a manufacturing method of an array substrate. The method comprises:

forming a pattern including a scanning line and a spacer base on a same layer of a substrate;

forming a gate insulating layer;

forming a semiconductor thin film, a doped semiconductor thin film and a source-drain metal thin film; forming a pattern including an active layer data line, a source electrode and a drain electrode through a patterning process;

forming a passivation layer;

through a dry etching method, sequentially etching the passivation layer and the gate insulating layer to form a via hole exposing the spacer base, and through an electric field formed by the spacer base exposed in the via hole and etching gas adopted in the reaction cavity of the etching equipment in the etching process, inducing materials generated from the etching process in the reaction cavity to deposit on the surface of the spacer base to form a spacer.

For example, in the dry etching process, the passivation layer, the active layer and the gate insulating layer are sequentially etched, to form the via hole exposing the spacer base.

For example, in the dry etching process, a first etching gas containing sulfur hexafluoride gas and chlorine gas is used for etching the active layer; a second etching gas containing sulfur hexafluoride gas, chlorine gas and oxygen gas is used for etching the gate insulating layer and the passivation layer.

For example, the second etching gas further contains helium gas.

For example, the spacer base is a metal pattern for manufacturing the spacer thereon. When the spacer base is etched, the metal on the surface of the spacer base reacts with the second etching gas to form a metal chloride on the surface of the spacer base.

For example, when the temperature in the reaction cavity is at 30° C.~50° C., and the pressure is 50~70 Pa, the flow of the sulfur hexafluoride gas in the second etching gas is 50~200 sccm, the flow of oxygen gas is 100~300 sccm, the flow of helium gas is 50~100 sccm and the flow of chlorine gas is 10~50 sccm; when the power applied to a plasma etching device is 5000~9000 watts, the growth speed of the spacer is 150~250 Å/s.

For example, the scanning line and the spacer base which are mutually parallel are manufactured, or the scanning line and the spacer base which are mutually crossed are manufactured. For example, the scanning line and the spacer base are manufactured in a same process and with a same material.

In addition, the spacer base is manufactured before the scanning line. Or, the scanning line is manufactured before the spacer base. In addition. The scanning line and the spacer base are respectively manufactured with different metal materials.

The spacer can be in any shape such as linear, square, round, triangular and polygonal shapes; but it should be at least guaranteed that the spacer base is located on a position where the spacer is arranged.

For example, the substrate is a glass substrate.

Figure 2:
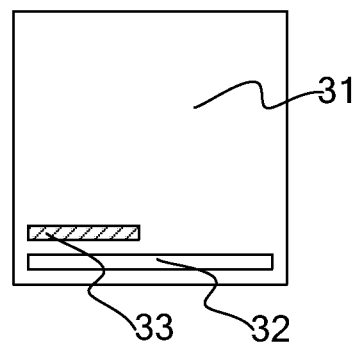
FIG. 2 and FIG. 3 are location schematic diagrams of the scanning line and the spacer base.
Figure 3:
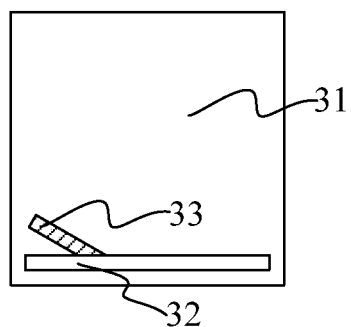

Below, the manufacturing method of the array substrate according to an embodiment of the present invention will be introduced in detail in conjunction with attached drawings. The method comprises the following steps:

Step S1: referring to FIG. 2, depositing a metal layer such as molybdenum (Mo), aluminum (Al) and cadmium (Cr) on a glass substrate 31, and forming a pattern including a scanning line 32 and a spacer base 33 on a same layer through a patterning process, to manufacture the scanning line 32 and the spacer base 33 which are mutually parallel as shown in FIG. 2 or the scanning line 32 and the spacer base 33 which are mutually crossed as shown in FIG. 3. It is important to note that the position of the manufactured spacer base 33 shall be in correspondence with the position where a spacer is to be arranged. Meanwhile, in order to manufacture the spacer base 33 crossed with the scanning line 32, a crossed position region shall not be overlapped with a position region where the spacer is to be arranged, so as to avoid adverse effect on transmission function of the scanning line.

Figure 4:
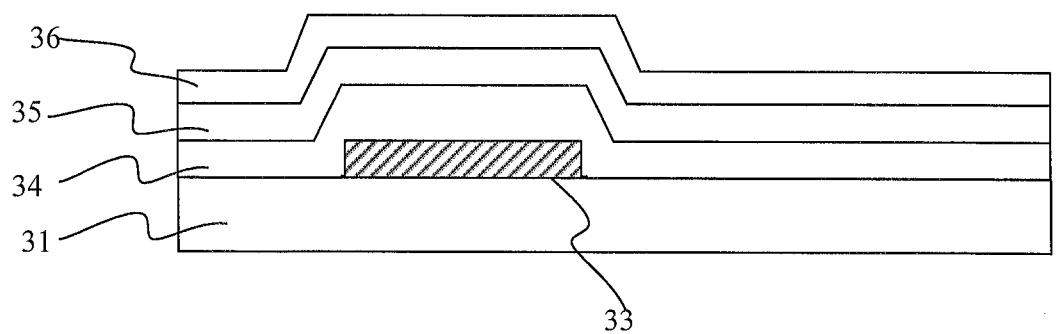
FIG. 4 is a sectional structural schematic diagram of the array substrate after manufacturing the passivation layer.

Step S2: referring to FIG. 4, depositing a silicon nitride ($SiN_x$) or silicon oxide ($SiO_x$) layer on a substrate where the pattern including the scanning line 32 and the spacer base 33 is formed, and forming a gate insulating layer 34 through the patterning process.

Step S3: depositing a semiconductor thin film, a doped semiconductor thin film and a source-drain metal thin film on the substrate where the gate insulating layer 34 is formed, and forming an active layer 35 (see FIG. 4), a source electrode (not shown) of the array substrate and a drain electrode (not shown) of the array substrate on the gate insulating layer 34 through a dual-tone mask (for example, a half-tone mask or a gray-tone mask).

Figure 5:
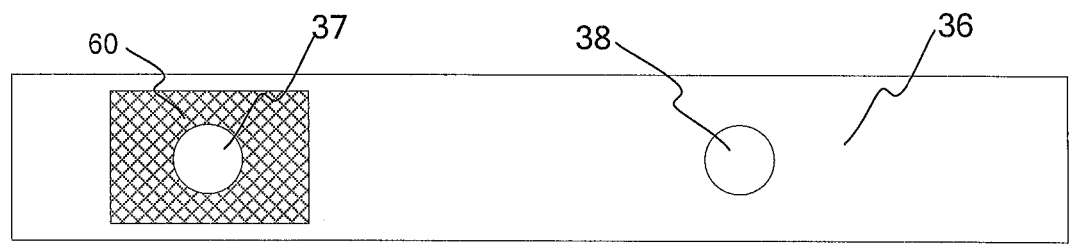
FIG. 5 is a structural schematic diagram of the array substrate after manufacturing the pixel electrode.

Step S4: depositing a silicon nitride thin film on the substrate where the active layer 35, the source electrode and the drain electrode are formed, to form a passivation layer 36 (see FIG. 4); and carrying out a patterning process upon the passivation layer 36, to form a first via hole 37 (see FIG. 5).

Step S5: depositing an indium tin oxide (ITO) transparent conductive thin film on the passivation layer 36 through a magnetron sputtering method, forming a pixel electrode 60 (see FIG. 5) through a patterning process, the pixel electrode 60 being directly connected to the drain electrode of the array substrate through the first via hole 37 of the passivation layer 36.

Figure 6:
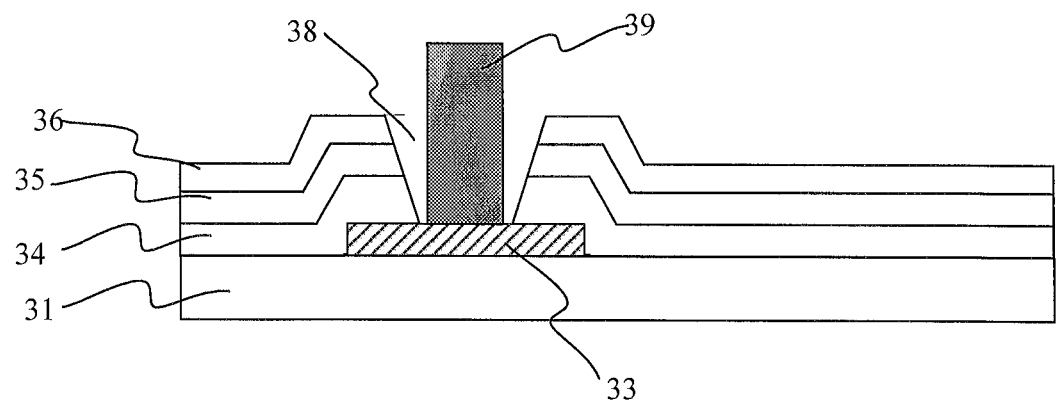
FIG. 6 is a sectional structural schematic diagram of the array substrate with the spacer according to an embodiment of the present invention.

Step S6: referring to FIG. 6, etching the passivation layer 36 through a dry etching method to form a second via hole 38 so as to expose the spacer base. For example, the process comprises: in a dry etching process, etching the passivation layer 36 on a position where the spacer is to be arranged through a second etching gas containing sulfur hexafluoride gas, chlorine gas and oxygen gas. In the process, compared with the first etching gas which contains sulfur hexafluoride gas and chlorine gas and is free from oxygen ($O_2$), the second etching gas added with the $O_2$ can improve the etching rate and uniformity of SiNx.

Step S7: converting the second etching gas into the first etching gas to etch the active layer 35, so that the second via hole 38 continues to deepen downwards.

Step S8: because the gate insulating layer 34 and the passivation layer 36 are made from a same material, converting the first etching gas into the second etching gas to etch the gate insulating layer 34, so that the second via hole 38 continues to deepen downwards until the surface of the spacer base 33 is exposed. So far, the second via hole 38 running through the passivation layer 36, the active layer 35 and the gate insulating layer 34 is formed.

Step S9: carrying out a reaction between the metal on the surface of the spacer base 33 and the second etching gas to form a metal chloride on the surface of the spacer base; meanwhile, forming an electric field through the spacer base exposed in the second via hole 38 and the etching gas in the etching device reaction cavity adopted in the etching process, to induce materials generated in the etching process in the reaction cavity to deposit on the surface of the spacer base, and generating a spacer 39 through a crystal growth process. The spacer 39 is of a columnar structure which mainly contains $SiCl_4$, the $SiCl_4$ is the production of the manufacturing materials of the gate insulating layer and the passivation layer and the etching gas for etching the second via hole 38; in addition, the spacer 39 further contains a metal chloride, and the metal chloride is generated from the reaction between the surface metal of the spacer base 33 and the etching gas.

The height of the spacer 39 can be controlled depending on its growth speed and growth time period. Within certain time period, the faster the growth speed is, the higher the spacer 39 is. Given a certain growth speed, the longer the growth time is, the higher the spacer 39 is.

The growth speed of the spacer 39 is related to growth environment, and can be controlled by controlling the temperature and pressure in the reaction cavity as well as the concentration of the etching gas; for example, when the temperature in the reaction cavity is 30° C.~50° C. and the pressure is 50~70 Pa, the flow of the sulfur hexafluoride gas in the second etching gas is 50~200 sccm, the flow of the oxygen gas is 100~300 sccm, the flow of the helium is 50~100 sccm and the flow of the chlorine gas is 10~50 sccm; when the power applied to a plasma etching device is 5000~9000 watts, a growth speed of the spacer 39 is 150~250 Å/s.

It should be pointed out that, referring to FIG. 5, in an etching process with the dry etching method, because other via holes (for example, the first via hole 37 for connecting the pixel electrode 60 and the drain electrode), except the second via hole 38, are protected by indium tin oxide, spacers will not be formed in the other via holes, except the second via hole 38, in the dry etching process; therefore, functions of the other via holes, except the second via hole 38, are not affected.

After the above mentioned steps, the array substrate with the sectional structure as shown in FIG. 6 according to the embodiment of the present invention is manufactured. The array substrate formed by the method is provided with the spacer thereon, and the spacer has such advantages as high hardness and difficulty in breaking; the problem of poor display of the spacer due to damage is effectively solved and display effect of the liquid crystal display device is enhanced.

An embodiment of the present invention provides an array substrate. The array substrate comprises a substrate, a scanning line, a spacer base, a gate insulating layer, an active layer, a passivation layer, a spacer and a second via hole; the spacer base and the scanning line are arranged on a same layer and are located above the substrate; the gate insulating layer is provided on the spacer base and the scanning line; the active layer is provided on the gate insulating layer; the passivation layer is arranged on the active layer; the second via hole runs through the gate insulating layer and the passivation layer to expose the spacer base; the spacer is provided in the second via hole and is located on the spacer base exposed by the second via hole.

For example, the second via hole runs through the gate insulating layer, the active layer and the passivation layer to expose the spacer base.

For example, the spacer contains silicon chloride ($SiCl_4$), and the $SiCl_4$ is the reactant of the manufacturing material of the gate insulating layer and the passivation layer with the second etching gas. For example, the spacer further contains metal chloride, and the metal chloride is generated from the reaction between the surface metal of the spacer base and the etching gas.

For example, the spacer is a columnar spacer which is arranged in the second via hole and located on the spacer base, to realize the function of supporting, so as to avoid the phenomenon that liquid crystal molecules cannot be normally rotated due to extrusion and deformation.

For example, the spacer base and the scanning line are made from the same material. For example, the spacer base and the scanning line are arranged in a parallel manner or in a crossed manner.

For example, the spacer base can be in any shape such as linear, square, round, triangular or polygonal shape.

Hereinafter, the array substrate according to an embodiment of the present invention is described in detail in conjunction with attached drawings. Structure of the array substrate is shown in FIG. 6. FIG. 6 is a sectional structural diagram of the array substrate with the spacer base. It can be seen from FIG. 6 that the array substrate comprises: a substrate 31, a spacer base 33, a gate insulating layer 34, an active layer 35, a passivation layer 36, a second via hole 38 and a spacer 39. In addition, the array substrate further comprises structures not shown in FIG. 6, such as a scanning line, a first via hole, a gate electrode, a source electrode, a drain electrode, a pixel electrode, etc.

For example, the gate electrode, the scanning line and the spacer base 33 are arranged on a same layer and are located above the substrate 31. For example, the spacer base 33, which is in a linear form, can be set in parallel with the scanning line or crossed with the scanning line. Furthermore, for example, the gate electrode of the array substrate, the scanning line and the spacer base 33 are made from the same material such as molybdenum (Mo), aluminum (Al), cadmium (Cr), copper (Cu) or other metals.

The gate insulating layer 34 is arranged above the gate electrode of the array substrate, the scanning line and the spacer base 33 for insulating the gate electrode of the array substrate, the scanning line and the spacer base 33 from other layers, and is made from such material as silicon nitride ($SiN_x$) or silicon oxide ($SiO_x$).

The active layer 35 is arranged on the gate insulating layer 34.

The source electrode and the drain electrode of the array substrate are arranged on a same layer, and are arranged on the active layer 35 to face each other.

Both the source electrode and the drain electrode of the array substrate are made from a conductive metal such as single-layer molybdenum (Mo) or cadmium (Cr) or double-layer aluminum-niobium alloy molybdenum (AlNd/Mo).

The passivation layer 36 is provided on the source electrode and drain electrode of the array substrate; for example, the passivation layer is made from the same material as the gate insulating layer 34, such as silicon nitride ($SiN_x$) or silicon oxide ($SiO_x$).

The pixel electrode is arranged on the passivation layer 36, and is directly connected to the drain electrode of the array substrate through the first via hole in the passivation layer 36; the pixel electrode is made from a transparent conductive material such as indium tin oxide (ITO) and the like.

The second via hole 38 runs through the gate insulating layer 34, the active layer 35 and the passivation layer 36 to expose the spacer base 33.

The spacer 39 is arranged inside the second via hole 38 and located on the spacer base 33. The spacer 39 is of a columnar structure which mainly contains silicon chloride ($SiCl_4$); in addition, the material further contains some metal chloride which is generated from the reaction between the surface metal of the spacer base 33 and the second etching gas.

An embodiment of the present invention further provides a display panel, the display panel comprising the array substrate mentioned above.

In conclusion, the embodiments of the present invention provide an array substrate and a manufacturing method thereof as well as a display panel. In a process of manufacturing the array substrate, the passivation layer, the active layer and the gate insulating layer are sequentially etched through a dry etching method to form a via hole exposing a spacer base; when the surface of the spacer base is etched, an electric field is formed by the metal on the surface of the spacer base and etching gas in the reaction cavity; under the electric field, materials generated from the etching process are deposited on the surface of the spacer base to form a spacer; the spacer generated in the method, compared with a conventional spacer made from a resin material, has such advantages as high hardness and difficulty in breaking, and is capable of protecting liquid crystal molecules around away from extrusion and deformation, so that the liquid crystal molecules can be rotated normally; therefore, display effect of the liquid crystal display is improved. In addition, by forming the spacer on the array substrate, a manufacturing process of the opposite substrate is simplified.

The foregoing embodiments merely are exemplary embodiments of the invention, and not intended to define the scope of the invention, and the scope of the invention is determined by the appended claims.

The invention claimed is:

1. A manufacturing method of an array substrate, comprising:
    forming a pattern including a scanning line and a spacer base on a same layer of a substrate;
    forming a gate insulating layer;
    forming another pattern including an active layer, a data line, a source electrode and a drain electrode;
    forming a passivation layer; and
    sequentially etching the passivation layer and the gate insulating layer through a dry etching method to form a via hole exposing the spacer base, and inducing materials generated from an etching process in a reaction cavity to deposit on a surface of the spacer base, through an electric field formed by the spacer base exposed in the via hole and etching gas adopted in the etching process, to form a spacer.

2. The method according to claim 1, wherein, in the etching process, the passivation layer, the active layer and the gate insulating layer are sequentially etched to form the via hole exposing the spacer base.

3. The method according to claim 2, wherein, in the etching process, a first etching gas containing sulfur hexafluoride gas and chlorine gas is used for etching the active layer.

4. The method according to claim 1, wherein, in the etching process, a second etching gas containing sulfur hexafluoride gas, chlorine gas and oxygen gas is used for etching the gate insulating layer and the passivation layer.

5. The method according to claim 4, wherein the second etching gas further contains helium gas.

6. The method according to claim 5, wherein, in the etching process, when temperature in the reaction cavity is at 30° C.~50° C., and pressure is 50~70 Pa, a flow of the sulfur hexafluoride gas in the second etching gas is 50~200 sccm, a flow of the oxygen gas is 100~300 sccm, a flow of the helium gas is 50~100 sccm and a flow of the chlorine gas is 10~50 sccm; when power applied to a plasma etching device is 5000~9000 watts, a growth speed of the spacer is 150~250 Å/s.

7. The method according to claim 1, wherein the spacer contains silicon chloride, the silicon chloride being a reactant of a manufacturing material of the gate insulating layer and the passivation layer with the etching gas.

8. The method according to claim 7, wherein the spacer further contains a metal chloride, the metal chloride being generated from a reaction between the spacer base and the etching gas.

9. The method according to claim 1, wherein the spacer is a columnar spacer.

10. The method according to claim 1, wherein the spacer base is same as the scanning line in manufacturing material.

11. The method according to claim 1, wherein the spacer base and the scanning line are arranged in parallel, or the spacer base and the scanning line are arranged in a crossed manner.

12. An array substrate, comprising a substrate, a scanning line, a spacer base, a gate insulating layer, an active layer, a passivation layer, a spacer and a via hole, wherein:
    the spacer base and the scanning line are arranged on a same layer and are located above the substrate;
    the gate insulating layer is located on the spacer base and the scanning line;
    the active layer is provided on the gate insulating layer;
    the passivation layer is provided on the active layer;
    the via hole runs through the gate insulating layer and the passivation layer to expose the spacer base; and the spacer is provided in the via hole and is located above the spacer base, wherein the spacer contains silicon chloride.

13. The array substrate according to claim 12, wherein the via hole runs through the gate insulating layer, the active layer and the passivation layer to expose the spacer base.

14. The array substrate according to claim 12, wherein the spacer further contains a metal chloride.

15. The array substrate according to claim 12, wherein the spacer is a columnar spacer.

16. The array substrate according to claim 12, wherein the spacer base is same as the scanning line in manufacturing material.

17. The array substrate according to claim 12, wherein the spacer base and the scanning line are arranged in parallel, or the spacer base and the scanning line are arranged in a crossed manner.

18. A display panel, comprising an array substrate that includes a substrate, a scanning line, a spacer base, a gate insulating layer, an active layer, a passivation layer, a spacer and a via hole, wherein:
   the spacer base and the scanning line are arranged on a same layer and are located above the substrate;
   the gate insulating layer is located on the spacer base and the scanning line;
   the active layer is provided on the gate insulating layer;
   the passivation layer is provided on the active layer;
   the via hole runs through the gate insulating layer and the passivation layer to expose the spacer base; and
   the spacer is provided in the via hole and is located above the spacer base, wherein the spacer contains silicon chloride.

* * * * *